United States Patent
Iwata et al.

(10) Patent No.: US 8,440,050 B2
(45) Date of Patent: May 14, 2013

(54) PLASMA PROCESSING APPARATUS AND METHOD, AND STORAGE MEDIUM

(75) Inventors: Manabu Iwata, Nirasaki (JP); Hiroyuki Nakayama, Nirasaki (JP); Kenji Masuzawa, Nirasaki (JP); Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1024 days.

(21) Appl. No.: 12/372,156

(22) Filed: Feb. 17, 2009

(65) Prior Publication Data

US 2009/0206058 A1 Aug. 20, 2009

Related U.S. Application Data

(60) Provisional application No. 61/048,234, filed on Apr. 28, 2008.

(30) Foreign Application Priority Data

Feb. 18, 2008 (JP) .................. 2008-036195

(51) Int. Cl.
- *C23F 1/00* (2006.01)
- *H01L 21/306* (2006.01)
- *G06F 19/00* (2011.01)

(52) U.S. Cl.
USPC ............... 156/345.44; 156/345.28; 216/67; 438/710; 700/121

(58) Field of Classification Search ............ 156/345.44, 156/345.24, 345.28, 345.43–345.47; 118/723 E, 118/715, 722, 723 R; 216/59, 67; 427/8, 427/248.1, 569; 438/706, 707, 710; 700/95, 700/117, 121; 315/111.21

See application file for complete search history.

(56) References Cited

U.S. PATENT DOCUMENTS

| 6,642,149 B2 | 11/2003 | Suemasa et al. |
| 2006/0221540 A1 | 10/2006 | Himori et al. |

FOREIGN PATENT DOCUMENTS

| JP | 2000-156370 | 6/2000 |
| JP | 2006-286814 | 10/2006 |
| JP | 2006-286814 A | 10/2006 |
| JP | 2007-266533 A | 10/2007 |

*Primary Examiner* — Maureen Gramaglia
(74) *Attorney, Agent, or Firm* — Rothwell, Figg, Ernst & Manbeck, P.C.

(57) ABSTRACT

A plasma processing apparatus includes a vacuum evacuable processing chamber, a first electrode divided into an outer electrode and an inner electrode, a second electrode, a first and a second high frequency power application unit for applying to the second electrode a first and a second high frequency power having a relatively high frequency and a relatively low frequency, respectively, a first and a second DC voltage application circuit apply a DC voltage to the outer and the inner electrode, respectively, and a processing gas supply unit. A space between the first electrode and the second electrode serves as a plasma generation space, and frequency-impedance characteristics of the outer electrode are set such that the impedance increases at the frequency of the second high frequency power and decreases at the frequency of the first high frequency power as the DC voltage applied to the outer electrode increases.

14 Claims, 4 Drawing Sheets

PLASMA PROCESSING APPARATUS AND METHOD, AND STORAGE MEDIUM

FIELD OF THE INVENTION

The present invention relates to a plasma processing apparatus and method for performing plasma processing on a substrate to be processed such as a semiconductor substrate or the like, and a storage medium.

BACKGROUND OF THE INVENTION

For example, in a manufacturing process of semiconductor devices, a single wafer plasma etching process for etching a substrate to be processed by using a plasma while using a resist as a mask is widely employed to form a predetermined pattern on a predetermined layer on a semiconductor wafer as the substrate to be processed.

Among various plasma processing apparatuses for performing such single wafer plasma etching process, a capacitively coupled parallel plate type etching apparatus has been mainly used.

The capacitively coupled parallel plate type plasma etching apparatus includes a pair of parallel plate type electrodes (an upper electrode and a lower electrode) disposed in a chamber, wherein a substrate to be processed is mounted on the lower electrode. By applying a high frequency power to either one of the two electrodes while introducing a processing gas into the chamber in a vacuum state, a high frequency electric field is formed between the two electrodes. Then, electrons are accelerated by the high frequency electric field. Ionization by collision between the electrons and a processing gas generates a plasma, so that a plasma etching can be performed on a predetermined layer of the semiconductor wafer by using the plasma.

In the capacitively coupled parallel plate type plasma etching apparatus, a cathode coupling method in which a high frequency power is applied to a lower electrode which mounts thereon a substrate to be processed and serves as a cathode enables an anisotropic etching by attracting ions in the plasma to the substrate with a self-bias voltage generated in the lower electrode.

Recently, in this cathode coupled type, there is suggested a dual frequency application type in which a first high frequency power of a relatively high frequency (generally greater than or equal to about 27 MHz) for plasma generation and a second high frequency power of a relatively low frequency (generally lower than or equal to about 13 MHz) for ion attraction are superposedly applied to the lower electrode for supporting the substrate (e.g., Japanese Patent Laid-open Application No. 2000-156370).

The lower electrode dual frequency application type is advantageous in that plasma density and anisotropic etching selectivity can be individually optimized by the first and the second high frequency power, and also in that the second high frequency power of a relatively low frequency can effectively suppress adhesion of deposits such as polymer and the like on the upper electrode.

With a recent trend of miniaturization of design rules for the manufacturing process of semiconductor devices or the like, plasma etching requires high dimension accuracy and, also, improved in-plane uniformity or etching selectivity to a base or a mask. Thus, the processing region in the chamber requires a low pressure and low ion energy. For that reason, a frequency considerably higher than a conventional frequency, which is higher than or equal to 40 MHz, is used for plasma generation.

However, when a high frequency power having a high frequency is used for plasma generation, a high frequency current tends to be concentrated at a central portion of an electrode. Since a plasma potential at the central portion becomes higher than that at the edge portion, the plasma density becomes non-uniform. Moreover, in the low-pressure and low-ion energy plasma generated by using the high frequency power of the high frequency, the non-uniformity of the plasma density caused by the in-plane non-uniformity of the plasma potential easily leads to non-uniformity of the processing or charge-up damages.

In order to solve the above-described problems, Japanese Patent Laid-open Application No. 2006-286814 suggests a technique for improving in-plane uniformity of plasma processing parameters such as an etching rate and the like by controlling a spatial distribution of a plasma potential by independently applying a DC voltage to an inner electrode and an outer electrode of an upper electrode.

However, even when the technique disclosed in Japanese Patent Laid-open Application No. 2006-286814 is applied to the plasma processing apparatus of the lower electrode dual frequency application type, there are generated problems in which a control range of an etching rate or the like decreases and deposits increased due to an improved etching rate causes CD (Critical Dimension) non-uniformity.

SUMMARY OF THE INVENTION

In view of the above, the present invention provides a plasma processing apparatus and a plasma processing method capable of suppressing drawbacks such as CD non-uniformity and the like caused by deposits and increasing a control range of uniformity of plasma processing in a lower electrode dual frequency application type.

In accordance with an aspect of the present invention, there is provided a plasma processing apparatus including: a vacuum evacuable processing chamber accommodating therein a substrate to be processed; a first electrode provided in the processing chamber and divided into an outer electrode forming an outer portion of the first electrode and an inner electrode forming a central portion of the first electrode; a second electrode disposed in the processing chamber so as to face the first electrode and supporting the substrate to be processed; a first high frequency power application unit for applying to the second electrode a first high frequency power having a relatively high frequency; a second high frequency power application unit for applying to the second electrode a second high frequency power having a relatively low frequency; a first DC voltage application circuit for applying a DC voltage to the outer electrode; a second DC voltage application circuit for applying a DC voltage to the inner electrode; and a processing gas supply unit for supplying a processing gas into the processing chamber.

Wherein a space between the first electrode and the second electrode serves as a plasma generation space, and wherein frequency-impedance characteristics of the outer electrode when the first electrode is seen from the plasma generation space, the outer electrode are set such that the impedance increases at the frequency of the second high frequency power and decreases at the frequency of the first high frequency power as the DC voltage applied to the outer electrode increases.

In frequency-impedance characteristics of the inner electrode when the first electrode is seen from the plasma generation space, frequency-impedance characteristics of the second DC voltage application circuit seen from the inner electrode may be set such that the impedance increases at the frequency of the second high frequency power and at the frequency of the first high frequency power as the DC voltage applied to the inner electrode increases.

The impedance of the first DC voltage application circuit seen from the upper electrode may be set such that an impedance of a plasma sheath formed when the DC voltage applied to the outer electrode is maximum is cancelled at the frequency of the first high frequency power.

When no DC voltage is applied to the outer and the inner upper electrode, the frequency-impedance characteristics of the second DC voltage application circuit seen from the inner upper electrode and the frequency-impedance characteristics of the first DC voltage application circuit seen from the outer electrode may be set such that the impedance at the frequency of the first high frequency power becomes higher than the impedance at the frequency of the second high frequency power.

The first DC voltage application circuit may include a low pass filter for suppressing introduction of a frequency of the first high frequency power, and the frequency-impedance characteristics of the first DC voltage application circuit seen from the outer electrode are set by adjusting frequency-impedance characteristics of the low pass filter.

The second DC voltage application circuit may have a low pass filter for suppressing introduction of a frequency of the second high frequency power, and the frequency-impedance characteristics of the second DC voltage application circuit seen from the inner electrode are set by adjusting frequency-impedance characteristics of the low pass filter.

The frequency-impedance characteristics of the first DC voltage application circuit seen from the outer electrode may be set such that a frequency slightly lower than the frequency of the first high frequency power is a series resonance frequency, and the series resonance frequency also exists close to the frequency of the second high frequency power.

The frequency of the first high frequency power may range from 30 MHz to 110 MHz, and the frequency of the second high frequency power may range from 0.1 MHz to 30 MHz.

A plasma processing method for performing plasma processing on a substrate to be processed in the plasma processing apparatus described above, including: setting a DC voltage applied to the inner electrode to a predetermined value; determining processing conditions by adjusting a DC voltage applied to the outer electrode while applying the DC voltage to the inner electrode so that desired uniformity of the plasma density is obtained; and performing the plasma processing under the above conditions.

A computer-executable storage medium which stores a program for controlling a plasma processing apparatus, wherein the program, when executed, controls the plasma processing apparatus to perform the plasma processing method described above.

In accordance with the present invention, in the frequency-impedance characteristics of the outer electrode when seen the first electrode from the plasma generation space side, the frequency-impedance characteristics of the first DC voltage application circuit seen from the outer electrode are set so that as the DC voltage applied to the outer electrode increases, the impedance decreases at the frequency of the first high frequency power and increase at the frequency of the second high frequency power.

Hence, the first high frequency power of the first high frequency power is guided to the outer electrode. Further, a higher plasma density can be obtained, and the control margin of the plasma density in the outer portion can be increased. Moreover, the high frequency power of the second high frequency power is isolated from the outer electrode, and the self-bias effect obtained by applying the first high frequency power is suppressed. Furthermore, the deposition enhancement effect of the plasma by the DC voltage application can be reduced, so that it is possible to suppress the drawback such as CD non-uniformity or the like caused by deposits.

In this apparatus, first of all, a DC voltage applied to the inner electrode is set to a predetermined level and, then, a DC voltage applied to the outer electrode is adjusted while applying the DC voltage to the inner electrode so as to obtain desired uniformity of the plasma density. The processing conditions are determined in the above manner, and the plasma processing is performed under the processing conditions thus determined. Therefore, the appropriate plasma processing conditions can be selected.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Embodiments of the present invention will be described with reference to the accompanying drawings which form a part hereof.

Figure 1:
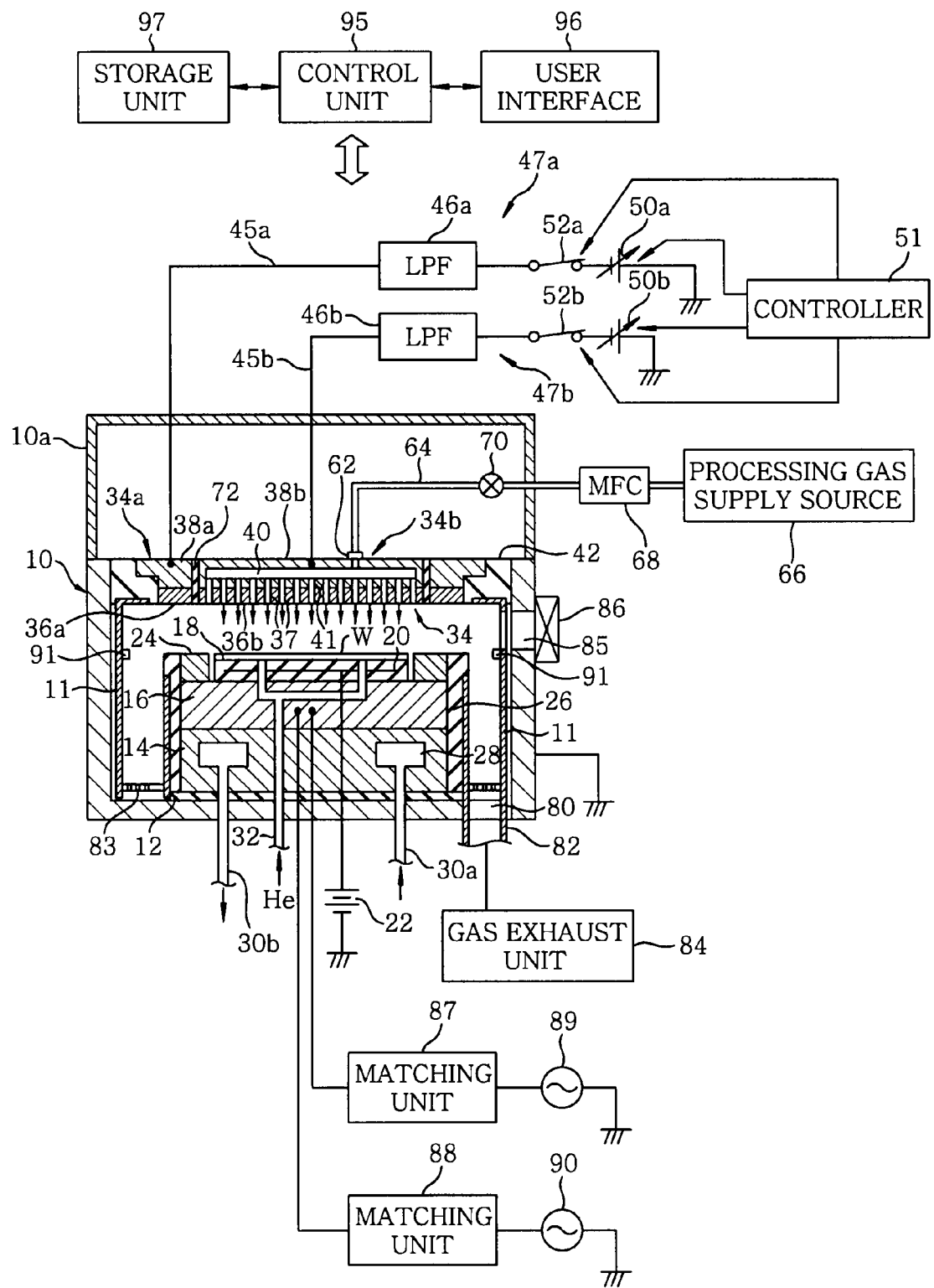
FIG. 1 is a schematic cross sectional view showing a plasma etching apparatus in accordance with an embodiment of the present invention.

Hereinafter, a plasma etching apparatus in accordance with an embodiment of a plasma processing apparatus of the present invention will be described. FIG. 1 is a schematic cross sectional view showing a plasma etching apparatus in accordance with an embodiment of the present invention. This plasma etching apparatus is configured as a capacitively coupled parallel plate type plasma etching apparatus having a substantially cylindrical chamber (processing vessel) 10 made of, e.g., aluminum having an anodically oxidized surface. The chamber 10 is frame-grounded.

A columnar susceptor support 14 is provided on a bottom portion of the chamber 10 via an insulating plate 12 made of ceramic or the like. Further, a susceptor 16 made of, e.g., aluminum, is disposed on the susceptor support 14. The susceptor 16 serves as a lower electrode, and mounts thereon a semiconductor wafer W as a substrate to be processed.

An electrostatic chuck 18 for attracting and holding the semiconductor wafer W by electrostatic force is provided on a top surface of the susceptor 16. The electrostatic chuck 18 is formed by embedding an electrode 20 made of a conductive film in a pair of insulation layers or insulation sheets. A DC power supply 22 is electrically connected to the electrode 20. Moreover, the semiconductor wafer W can be attracted and held on the electrostatic chuck 18 by electrostatic force such as Coulomb force or the like generated by a DC voltage applied from the DC power supply 22.

A conductive focus ring (calibration ring) 24 for improving etching uniformity is provided on the top surface of the susceptor 16 to surround the electrostatic chuck 18 (the semiconductor wafer W), the focus ring 24 being made of, e.g., silicon. A cylindrical inner wall member 26 made of, e.g., quartz, is attached to lateral surfaces of the susceptor 16 and the susceptor support 14.

A coolant reservoir 28 extending in, e.g., a circumferential direction, is provided inside the susceptor support 14. A coolant maintained at a predetermined temperature, e.g., cooling water, supplied from a chiller unit (not shown) located outside via lines 30a and 30b is circulated in the coolant reservoir. A processing temperature of the semiconductor wafer W on the susceptor can be controlled by the temperature of the coolant.

Moreover, a thermally conductive gas, e.g., He gas, is supplied from a thermally conductive gas supply unit (not shown) to a space between the top surface of the electrostatic chuck 18 and the backside of the semiconductor wafer W via a gas supply line 32.

An upper electrode 34 is provided to face the susceptor 16 in parallel above the susceptor 16 serving as a lower electrode. Further, a space between the upper electrode 34 and the lower electrode 16 is becomes a plasma generation space. The upper electrode 34 forms a facing surface, i.e., a surface being in contact with the plasma generation space while facing the semiconductor wafer W on the susceptor 16 serving as the lower electrode.

The upper electrode 34 is supported at the top of the chamber 10 by an insulating shield member 42. The upper electrode 34 includes a ring-shaped or doughnut-shaped outer upper electrode 34a facing the susceptor 16 at a predetermined distance and a circular plate-shaped inner upper electrode 34b disposed radially inside the outer upper electrode 34a while being insulated therefrom.

The outer upper electrode 34a is separated from the inner upper electrode 34b by an annular gap of, e.g., about 0.25 to 2.0 mm. An insulation member 72 is provided in this gap.

The outer upper electrode 34a has an electrode plate 36a and an electrode support 38a made of a conductive material, e.g., aluminum having an anodically oxidized surface. The electrode support 38a holds the electrode plate 36a such that the electrode plate 36a can be detachably attached to the electrode support 38a. The electrode plate 36a preferably made of a semiconductor or a conductor having a low-resistance of a low Joule heat, e.g., silicon or SiC.

The inner upper electrode 34b has an electrode plate 36b having a plurality of gas injection openings 37, and an electrode support 38b made of a conductive material, e.g., aluminum having an anodically oxidized surface. The electrode support 38b holds the electrode plate 36b such that the electrode plate 36b can be detachably attached to the electrode support 38b. The electrode support 38b has therein a gas diffusion space 40. A plurality of gas through holes extends downward from the gas diffusion space 40 to communicate with the gas injection openings 37.

A gas inlet opening 62 is formed in the electrode support 38b to introduce a processing gas into the gas diffusion space 40. A gas supply line 64 is connected to the gas inlet opening 62, and a processing gas supply source 66 is connected to the gas supply line 64. The gas supply line 64 is provided with a mass flow controller (MFC) 68 and an opening/closing valve 70 sequentially disposed thereon from the upstream side. When a processing gas for etching, e.g., fluorocarbon gas ($C_xF_y$) such as $C_4F_8$ or the like, supplied from the processing gas supply source 66 is introduced into the gas diffusion space 40 via the gas supply line 64, the processing gas is injected in a shower shape from the gas through holes 41 and the gas injection openings 37 in the plasma generation space. That is, the upper electrode 34 serves as a shower head for supplying the processing gas.

A first variable DC power supply 50a is electrically connected to the outer upper electrode 34a via a first DC voltage application circuit 47a. The first DC voltage application circuit 47a has a power feed line 45a and a low pass filter (LPF) 46a for suppressing a high frequency current of about 40 MHz, the LPF 46a being provided in the power feed line 45a. The power feed of the first variable DC power supply 50a can be controlled by an on/off switch 52a.

A second variable DC power supply 50b is electrically connected to the inner upper electrode 34b via a second DC voltage application circuit 47b. The second DC voltage application circuit 47b has a power feed line 45b and a low pass filter (LPF) 46b for suppressing a high frequency current of about 40 MHz, the LPF 46b being provided in the power supply wire 35b. The power feed of the second variable DC power supply 50b can be controlled by an on/off switch 52b. The polarity, current and voltage of the first and the second variable DC power supply 50a and 50b and the on/off operation of the on/off switch 52 are controlled by a controller (control unit) 51.

The LPFs 46a and 46b suppress introduction of a high frequency from a first high frequency power supply to be described later, and adjust the impedance of the upper side first DC voltage application circuit 47a seen from the outer upper electrode 34a and the impedance of the upper side second DC voltage application circuit 47b seen from the inner upper electrode 34b in response to the frequencies of high frequency power supplies to be described. The LPFs 46a and 46b are preferably formed of LC filters.

A cylindrical ground conductor 10a having a cover is provided to extend upward compared to a height position of the upper electrode 34 from the sidewall of the chamber 10.

A first and a second high frequency power supply 89 and 90 are electrically connected to the susceptor 16 serving as the lower electrode via matching units 87 and 88, respectively. The first high frequency power supply 89 outputs a first high frequency power having a frequency equal to or higher than 27 MHz, e.g., 40 MHz. The second high frequency power supply 90 outputs a second high frequency power having a frequency equal to or lower than 13 MHz, e.g., 3.2 MHz.

The matching units 87 and 88 respectively matches a load impedance to internal (or output) impedances of the first and the second high frequency power supply 89 and 90. When a plasma is generated in the chamber 10, the matching units 87 and 88 serves to provide apparent matching between the internal impedances of the first and the second high frequency power supply 89 and 90 and the load impedance.

A gas exhaust port 80 is provided in a bottom portion of the chamber 10, and a gas exhaust unit 84 is connected to the gas exhaust port 80 via a gas exhaust line 82. The gas exhaust unit 84 has a vacuum pump such as a turbo-molecular pump or the like, so that an inside of the chamber 10 can be depressurized to a required vacuum level. Further, a loading/unloading port 85, through which the semiconductor wafer W is loaded and unloaded, is provided in the sidewall of the chamber 10. The loading/unloading port 85 can be opened and closed by a gate valve 86.

Further, a deposition shield 11 is detachably installed along the inner wall of the chamber 10 so as to prevent etching by-products (deposits) adhered to the chamber 10. In other words, the deposition shield 11 serves as the chamber wall. The deposition shield 11 is also provided at an outer peripheral portion of an inner wall member 26. A gas exhaust plate 83 is provided at the bottom portion of the chamber 10 between the deposition shield 11 provided at the inner wall member 26 and the deposition shield 11 provided at the chamber wall. The deposition shield 11 and the gas exhaust plate 83 are preferably formed by coating an aluminum material with ceramic such as $Y_2O_3$ or the like.

A conductive member (GND block) 91 DC-connected to the ground is provided to a portion of the deposition shield 11 forming the chamber inner wall at a height position substantially identical with the wafer W. With this configuration, an abnormal discharge can be prevented.

Each component of the plasma etching apparatus is connected to and controlled by a control unit (system controller) 95. Further, a user interface 96 is connected to the control unit 95, wherein the user interface 96 includes, e.g., a keyboard for a process manager to input a command to operate the plasma etching apparatus, a display for showing an operational status of the plasma processing apparatus and the like.

Moreover, connected to the control unit 95 is a storage unit 97 which stores therein, e.g., control programs to be used in realizing various processes, which are performed in the plasma processing apparatus under the control of the control unit 95 and programs or recipes to be used in operating each component of the plasma processing apparatus to carry out processes in accordance with processing conditions. The recipes can be stored in a built-in storage medium such as a hard disk, or can be recorded on a portable storage medium such as a CDROM, a DVD and the like. Further, the recipes can be transmitted from another apparatus, via, e.g., a dedicated line.

When a command or the like is received from the user interface 96, the control unit 95 retrieves a necessary recipe from the storage unit 97 and executes the recipe. Accordingly, a desired process is performed in the plasma etching apparatus under the control of the control unit 95. The plasma processing apparatus (plasma etching apparatus) described in the embodiment of the present invention includes this control unit 95.

In order to perform the etching process in the plasma etching apparatus configured as described above, the gate valve 86 is first opened, and the semiconductor wafer W as an etching target is loaded into the chamber 10 via the loading/unloading port 85 and then is mounted on the susceptor 16. Next, a processing gas for etching is supplied at a predetermined flow rate from the processing gas supply source 66 into the gas diffusion space 40, and then is supplied into the chamber 10 via the gas through holes 41 and the gas injection openings 37. While the processing gas being supplied into the chamber 10, the interior of the chamber 10 is exhausted by the gas exhaust unit 84 to set the pressure inside the chamber 10 to be a predetermined value within a range from, e.g., about 0.1 to 150 Pa. The processing gas may be selected from various gases conventionally employed, and preferably is a gas containing a halogen element, a representative of which is a fluorocarbon gas ($C_xF_y$), such as $C_4F_8$ gas. Further, the processing gas may contain another gas, such as Ar gas or $O_2$ gas.

While the etching gas is introduced into the chamber 10, a first high frequency power for plasma generation is applied from the first high frequency power supply 89 to the susceptor 16, i.e., the lower electrode, at a predetermined power level and, also, a second high frequency power for ion attraction is applied from the second high frequency power supply 90 to the susceptor 16 at a predetermined power level. Moreover, a predetermined DC voltage is applied from the first and the second variable DC power supply 50a and 50b to the outer and the inner upper electrode 34a and 34b via the first and the second DC voltage application circuit 47a and 47b, respectively. A DC voltage is applied from the DC power supply 22 to the electrode 20 of the electrostatic chuck 18, whereby the semiconductor wafer W is firmly held on the susceptor 16.

The processing gas injected from the gas injection openings 37 formed in the electrode plate 36 of the upper electrode 34 is turned into a plasma by a glow discharge generated between the upper electrode 34 and the susceptor 16 serving as the lower electrode by the high frequency powers applied thereto. By radicals and ions generated from the plasma, a surface to be processed of the semiconductor wafer W is etched.

In this plasma etching apparatus, the first high frequency power of a relatively high frequency from the first high frequency power supply 89 and the second high frequency power of a relatively low frequency from the second high frequency power supply 90 are superposedly applied to the susceptor 16 serving as the lower electrode. Therefore, the control of the plasma density by the first high frequency power of the higher frequency and the control of the ion attraction by the second high frequency power of the lower frequency can be independently performed. Accordingly, it is possible to control the plasma density and the selectivity of the anisotropic etching. Further, such lower electrode dual frequency application type is advantageous in that the adhesion of deposits to the upper electrode 34 can be effectively suppressed by the second high frequency power of the lower frequency. Moreover, the high frequency power from the first high frequency power supply 89 has a high frequency, e.g., 40 MHz, so that a high-density plasma with low ion energy can be generated even at a low pressure level.

However, when the plasma is generated by the high frequency power of such a high frequency, the high frequency current tends to be concentrated on the central portion of the electrode, and the plasma potential at the central portion becomes higher than that at the edge portion. To avoid this, in the present embodiment, the spatial distribution of the plasma potential is controlled by independently applying DC voltages of proper levels from the first and the second variable DC power supply 50a and 50b to the outer and the inner upper electrode 34a and 34b of the upper electrode 34, respectively.

Figure 2:
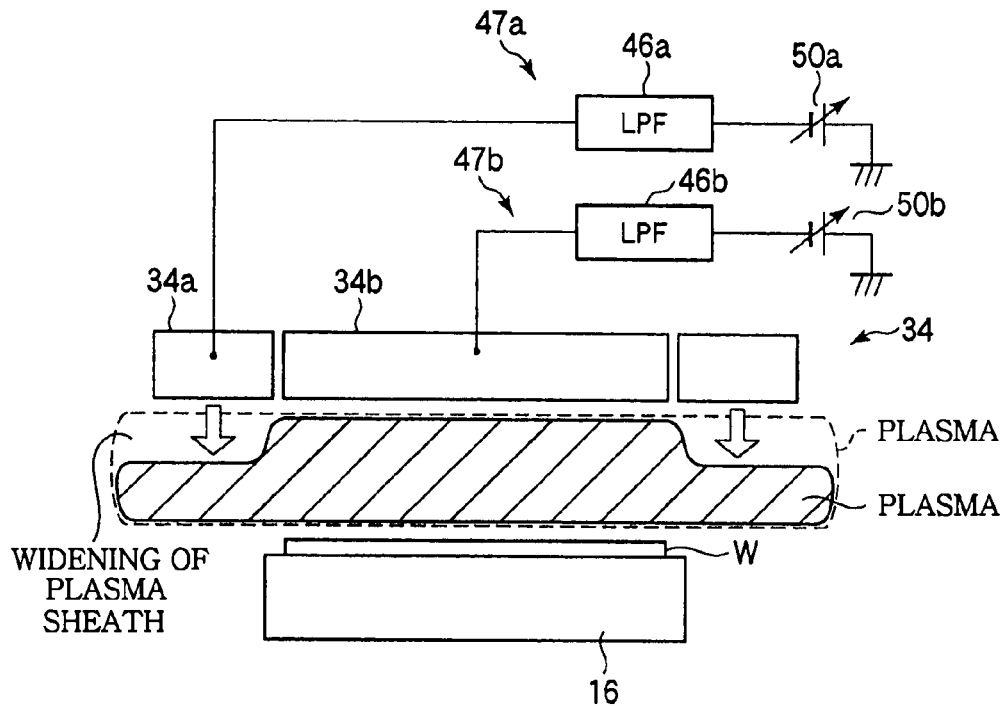
FIG. 2 schematically illustrates a plasma sheath in the case of applying a DC voltage to an outer upper electrode and an inner upper electrode in the apparatus shown in FIG. 1.

That is, when the DC voltage is applied to the upper electrode, the plasma sheath increases and, thus, the plasma spatial potential can be controlled. The spatial potential distribution at the outer and the inner portion of the plasma generation space can be controlled by independently adjusting the DC voltages applied from the first and the second variable DC power supply 50a and 50b to the outer and the inner upper electrode 34a and 34b via the first and the second DC voltage application circuit 47a and 47b. To be specific, the uniformity of the plasma density is realized by widening the plasma sheath by increasing the DC voltage applied to the outer upper electrode 34a, as shown in FIG. 2.

However, simple adjustment of DC voltages applied to the outer and the inner upper electrode 34a and 34b gives rise to narrow control ranges of a plasma density (electron density) and further plasma processing parameters such as an etching rate and the like and may also cause CD non-uniformity due to deposits increased by an improved etching rate.

Therefore, in the present embodiment, the frequency-impedance characteristics of the upper side first DC voltage application circuit 47a seen from the outer upper electrode 34a when the high frequency powers and the DC voltage are not applied are adjusted to be different from the frequency-impedance characteristics of the upper side second DC voltage application circuit 47b seen from the inner upper electrode 34b so that the effect obtained by applying the DC voltage to the outer upper electrode 34a can be enhanced.

To be specific, the impedance of the first DC voltage application circuit 47a seen from the outer upper electrode 34a is designed such that, in the frequency-impedance characteristics for the outer upper electrode 34a seen from the plasma generation space side in the case of applying the high frequency powers and the DC voltage, as the applied DC voltage increases, the impedance decreases at the frequency of the first high frequency power of the higher frequency and increases at the frequency of the second high frequency power of the lower frequency.

Accordingly, it is possible to increase the control range of the plasma density (electron density) and solve the side effects such as CD non-uniformity or the like caused by the increase of deposits. Such impedance design can be realized by adjusting the impedance of the LPF 46a, or by adjusting the impedance of the power feed line or the interelectrode capacitance.

Hereinafter, the case of adjusting the impedance of the LPF 46a will be described in detail as an example.

Figure 3:
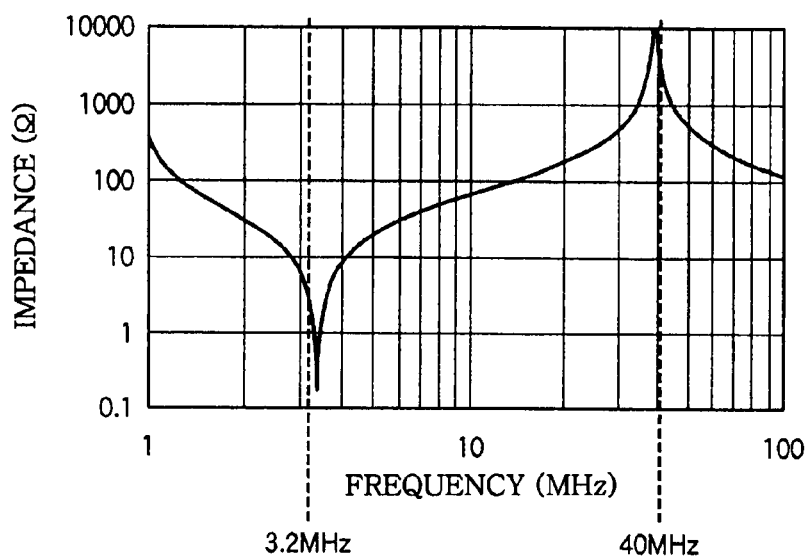
FIG. 3 provides a graph depicting frequency-impedance characteristics of a conventional low pass filter (LPF) used in a circuit for applying a DC voltage to the upper electrode.

Conventionally, when the frequencies of the first and the second high frequency power supply 89 and 90 are respectively set to, e.g., 40 MHz and 3.2 MHz, an LPF having frequency-impedance characteristics shown in FIG. 3 has been widely used as for an LPF of a DC voltage application circuit. That is, a parallel LC circuit used as the LPF generally has a parallel resonance frequency at which an impedance sharply increases at a specific frequency and a series resonance frequency at which an impedance sharply decreases at a specific frequency away from the parallel resonance frequency. The positions of the parallel resonance frequency and the series resonance frequency can be adjusted by changing impedance values of a coil which provides a positive impedance and a capacitor which provides a negative impedance.

In general, however, there is used one having characteristics as shown in FIG. 3 in which the parallel resonance frequency is about 40 MHz which is the first high frequency of the higher frequency, and the series resonance frequency is about 3.2 MHz which is the second high frequency of the lower frequency so that the impedance is high at about 40 MHz and the impedance is low at about 3.2 MHz. When the LPF having such characteristics is used in the DC voltage application circuit of the upper electrode, the frequency-impedance characteristics of the upper side seen from the upper electrode in the case of not applying the high frequency powers and the DC voltage become those, e.g., shown in FIG. 4. In other words, the series resonance frequency is close to 3.2 MHz, which is the frequency of the second high frequency power, and the parallel resonance frequency is close to 10 MHz. The impedance gradually decreases at 40 MHz, which is the frequency of the first high frequency power.

When the DC voltage is applied to the upper electrode while the plasma is generated, the plasma sheath corresponding to the applied DC voltage is formed. Further, the impedance curve obtained when the upper electrode is seen from the plasma generation side is shifted to the right compared to the impedance curve of FIG. 4, and the shift amount increases as the applied DC voltage increases.

Figure 4:
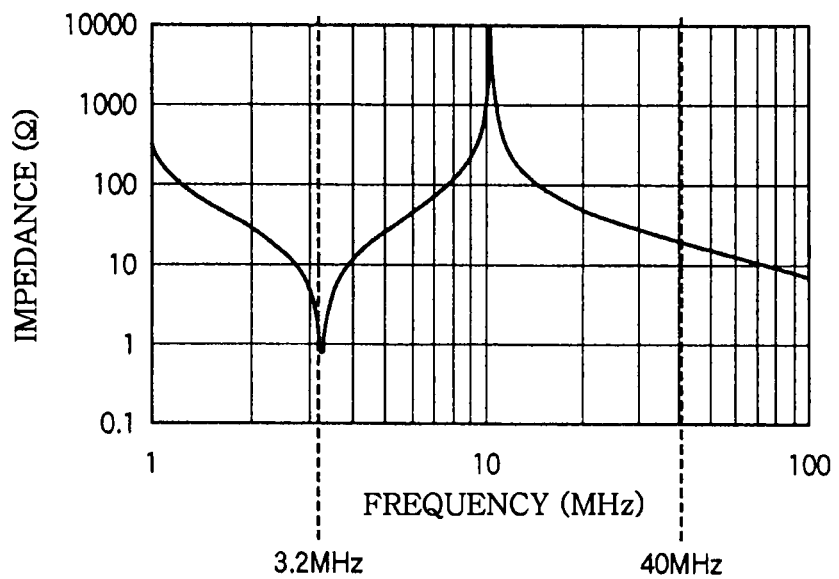
FIG. 4 presents a graph showing frequency-impedance characteristics of an upper side seen from the upper electrode in the case of using the LPF shown in FIG. 3.

If the impedance curve is shifted to the right, the impedance increases at 40 MHz, as can be seen from FIG. 4. However, the plasma density (electron density) is not sufficiently controlled even if such impedance characteristics are applied to the outer upper electrode 34a. Thus, the control range of the outer upper electrode 34a needs to be increased by the DC voltage application. On the contrary, in the inner upper electrode 34b, the improvement of the plasma density by the DC voltage application is not required, so that the conventional impedance curve can be applied.

The side effects such as CD non-uniformity or the like caused by deposits needs to be suppressed by reducing the self-bias voltage (Vdc) effect of the second high frequency power of 3.2 MHz and the deposition enhancement effect of the plasma caused by the DC voltage application.

Therefore, in the present embodiment, as for the LPF 46b of the circuit for applying a DC voltage to the inner upper electrode 34b, there is used one having the conventional impedance characteristics of FIG. 3. Moreover, as for the LPF 46a of the circuit for applying a DC voltage to the outer upper electrode 34a, there is used one having impedance characteristics illustrated in FIG. 5 in which the series resonance frequencies exist close to 60 MHz and 3.2 MHz, which is the frequency of the second high frequency power, and the parallel resonance frequency exists close to 15 MHz. As a consequence, the effect of the DC voltage application becomes more effective.

Figure 5:
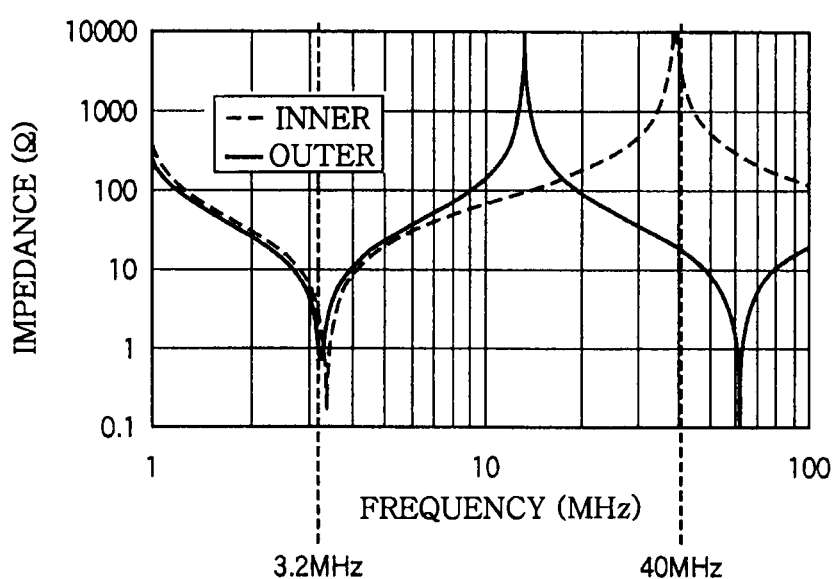
FIG. 5 offers a graph illustrating frequency-impedance characteristics of the LPF used in the circuit for applying a DC voltage to the inner upper electrode and the LPF used in the circuit for applying a DC voltage to the outer upper electrode in the apparatus shown in FIG. 1.
Figure 6:
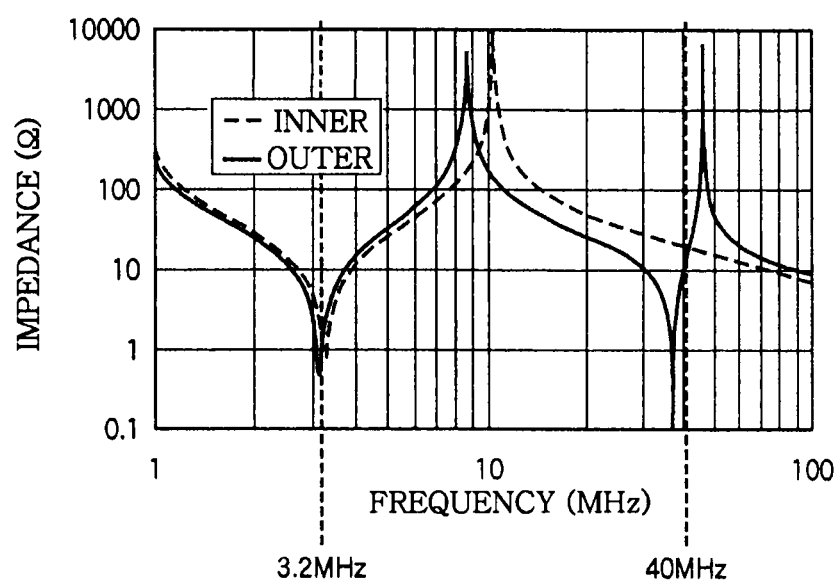
FIG. 6 represents a graph depicting frequency-impedance characteristics of the upper side seen from the inner upper electrode and those of the upper side seen from the outer upper electrode in the case of using the LPFs shown in FIG. 5.

By using the LPF 46a having the impedance characteristics depicted in FIG. 5, the frequency-impedance characteristics of the first DC voltage application circuit 47a of the upper side seen from the outer upper electrode 34a become those shown in FIG. 6, which are different from the frequency-impedance characteristics seen from the inner upper electrode 46b which are the same as the conventional characteristics.

That is, by using the LPF 46a having the characteristics of FIG. 5, the frequency-impedance characteristics of the first DC voltage application circuit 47a seen from the outer upper electrode 46a are set so that a series resonance frequency exists close to 3.2 MHz, which is the frequency of the second high frequency power of the lower frequency, and another series resonance frequency exists also close to a frequency slightly lower than 40 MHz, which is the frequency of the first high frequency power of the higher frequency.

Accordingly, when the plasma generation and the DC voltage application to the outer upper electrode 34a are simultaneously carried out, the impedance obtained when the outer upper electrode 34a is seen from the plasma generation side reveals the characteristics wherein the series resonance frequency become closer close to 40 MHz as the applied DC voltage increases. Therefore, the high frequency power of 40 MHz is guided to the outer upper electrode 34a, and a higher plasma density (electron density) can be obtained. That is, such impedance design enhances the plasma density (electron density) increasing effect by the DC voltage application.

Hence, the control margin of the plasma density at the outer portion can be increased, and the in-plane uniformity of the plasma density and further the in-plane uniformity of the processing characteristic such as an etching rate and the like can be controlled in a wide range. On the other hand, in the impedance obtained when the outer upper electrode 34a is seen from the plasma generation space side, the series resonance frequency moves further away from 3.2 MHz as the applied DC voltage increases. Thus, the high frequency power of 3.2 MHz is more isolated from the outer upper electrode 34a, and the self-bias voltage (Vdc) effect obtained by applying the high frequency power of 3.2 MHz is suppressed. Moreover, the deposition enhancement effect of the plasma by the DC voltage application decreases, so that it is possible to suppress the side effect such as CD non-uniformity or the like caused by deposits.

In the inner upper electrode 34*b*, however, the conventional impedance design is carried out such that at 40 MHz, the impedance increases and the increase of the plasma density is suppressed as the applied DC voltage increases. On the other hand, as the applied DC voltage increases, the series resonance frequency moves further away from 3.2 MHz as in the outer upper electrode 34*a*.

In FIGS. 3 to 6, an impedance Z of a vertical axis can be represented as: $Z=(R^2+X^2)^{1/2}$, where R indicates a resistance component and X indicates a reactance component and R is almost negligible, so that only X can be considered. X can be positive or negative at a specific frequency. X is positive when the gradient of the impedance curve at the frequency increases to the right, and X is negative when the gradient thereof decreases to the right. Therefore, as shown in FIG. 5, the impedance of the LPF 46*a* about $-1\Omega$ at 3.2 MHz and about $-20\Omega$ at 40 MHz. The impedance of LPF 46*b* is about $-3\Omega$ at 3.2 MHz and about $-4000\Omega$ at 40 MHz.

In the impedance of the upper side seen from the outer upper electrode 34*a*, 3.2 MHz is slightly higher than the series resonance frequency as shown in FIG. 6. This is because the impedance curve is shifted to the right when the high frequency is applied. In other words, in the impedance of the upper side seen from the outer upper electrode 34*a* before the DC voltage application, 3.2 MHz is made to be as close as possible to the series resonance frequency, but to be lower than the series resonance frequency to thereby enhance the effect of suppressing the deposition enhancement effect by the DC voltage application.

In the impedance adjustment described above, it is preferable to set the DC voltage applied to the outer upper electrode 34*a* so that the maximum impedance shift is made for the series resonance frequency shown in FIG. 6 not to exceed 40 MHz, which is the frequency of the first high frequency power. That is, it is preferable to set the upper side impedance seen from the outer upper electrode 34*a* such that the impedance of the plasma sheath which is formed by applying the maximum DC voltage to the outer upper electrode 34*a* is cancelled at 40 MHz. In other words, it is preferable that the series resonance frequency becomes 40 MHz when the maximum DC voltage is applied to the outer upper electrode 34*a*. If the DC voltage exceeds the above level, the impedance increases, which is not preferable.

Further, when the DC voltage is not applied, in the outer and the inner upper electrode 34*a* and 34*b*, the impedance at 40 MHz, which is the relatively higher frequency of the first high frequency power is preferably higher than the impedance at 3.2 MHz, which is the relatively lower frequency of the second high frequency power, as can be seen from FIG. 6. By setting a slightly higher impedance at 40 MHz, the first high frequency power less flows from the susceptor 16 serving as the lower electrode to the upper electrode and, hence, the ratio of the electron current in the plasma flowing in the wall portion increases relatively.

As a consequence, the plasma spreads toward the outer side in the radial direction, and the uniformity of the plasma density can be increased. On the other hand, by setting a slightly lower impedance at 3.2 MHz, which is the frequency of the second high frequency power, ions in the plasma which vibrate in accordance with the frequency of 3.2 MHz are incident on the upper electrode 34 with strong impact, enhancing the function of removing deposits on the surface of the upper electrode 34 by sputtering.

When the plasma processing conditions are set by adjusting DC voltages applied to the outer upper electrode 34*a* and the inner upper electrode 34*b* whose impedances are designed as described above, first of all, a DC voltage applied to the inner upper electrode 34*b* is determined by considering the deposit removability and the stability. Next, the DC voltage applied to the outer upper electrode 34*a* is adjusted while applying the determined DC voltage to the inner upper electrode 34*b* so that desired in-plane uniformity of the plasma density can be obtained.

After the DC voltage applied to the inner upper electrode 34*b* is appropriately determined, the DC voltage applied to the outer upper electrode 34*a* is adjusted while considering the uniformity. Therefore, appropriate plasma processing conditions can be reliably selected.

The present invention may be variously modified without being limited to the above embodiment. For example, in the above embodiment, the frequency of the first high frequency power for plasma generation is set to 40 MHz, and the frequency of the second high frequency power for ion attraction is set to 3.2. However, they are not limited thereto. As for the frequency of the first high frequency, it is possible to employ a frequency ranging from 30 MHz to 110 MHz, e.g., 100 MHz. As for the frequency of the second high frequency power, it is possible to employ a frequency ranging from 0.1 MHz to 30 MHz, e.g., 0.3 MHz or 13.56 MHz.

Besides, the aforementioned impedance characteristics of the LPFs 46*a* and 46*b* are only examples, and random characteristics can be used in accordance with the processes. Further, as for the LPF 46*a*, there can be used one having a variable impedance. Furthermore, the impedance of the upper side seen from the outer and the inner upper electrode 34*a* and 34*b* can be adjusted not only by the low pass filter but also by various methods such as the aforementioned adjustment of the impedance of the power feed line or the interelectrode capacitance, and the like. In the present invention, the impedance characteristics of the upper side seen from the inner upper electrode 34*b* are not particularly limited, and can be properly set in accordance with the processes.

Although the present invention is applied to the plasma etching in the above embodiment, it can also be applied to another plasma processing such as plasma CVD, plasma oxidation or the like. Further, in the above embodiment, the semiconductor wafer is used as a substrate to be processed. However, it is also possible to use another substrate such as a substrate for a flat panel display or the like.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
   a vacuum evacuable processing chamber accommodating therein a substrate to be processed;
   a first electrode provided in the processing chamber and divided into an outer electrode forming an outer portion of the first electrode and an inner electrode forming a central portion of the first electrode;
   a second electrode disposed in the processing chamber so as to face the first electrode and supporting the substrate to be processed;
   a first high frequency power application unit configured to apply to the second electrode a first high frequency power having a relatively high frequency;

a second high frequency power application unit configured to apply to the second electrode a second high frequency power having a relatively low frequency;

a first DC voltage application circuit configured to apply a DC voltage to the outer electrode;

a second DC voltage application circuit configured to apply a DC voltage to the inner electrode; and a processing gas supply unit configured to supply a processing gas into the processing chamber, wherein a space between the first electrode and the second electrode serves as a plasma generation space, and wherein the outer electrode has a frequency-impedance characteristic seen from the plasma generation space such that an increase of DC voltage to the outer electrode increases impedance of the outer electrode at the frequency of the second high frequency power, and an increase of DC voltage to the outer electrode decreases impedance of the outer electrode at the frequency of the first high frequency power.

2. The plasma processing apparatus of claim 1, wherein the inner electrode has a frequency-impedance characteristic seen from the plasma generation space such that an increase of DC voltage to the inner electrode increases impedance of the inner electrode at the frequency of the second high frequency power, and an increase of DC voltage to the inner electrode increases impedance of the inner electrode at the frequency of the first high frequency power.

3. The plasma processing apparatus of claim 1, wherein the first DC voltage application circuit has an impedance seen from the upper electrode which is set such that an impedance of a plasma sheath formed when the DC voltage applied to the outer electrode is a maximum is cancelled at the frequency of the first high frequency power.

4. The plasma processing apparatus of claim 1, wherein when no DC voltage is applied to the outer and the inner electrodes, the second DC voltage application circuit has a frequency-impedance characteristic seen from the inner upper electrode and the first DC voltage circuit has a frequency-impedance characteristic seen from the outer electrode such that impedance at the frequency of the first high frequency power is higher than impedance at the frequency of the second high frequency power.

5. The plasma processing apparatus of claim 1, wherein the first DC voltage application circuit includes a low pass filter configured to suppress introduction of a frequency of the first high frequency power, and the frequency-impedance characteristic of the outer electrode seen from the plasma generation space is set by adjusting frequency-impedance characteristics of the low pass filter.

6. The plasma processing apparatus of claim 1, wherein the second DC voltage application circuit includes a low pass filter configured to suppress introduction of a frequency of the second high frequency power, and wherein the inner electrode includes a frequency-impedance characteristic seen from the plasma generation space which is set by adjusting frequency-impedance characteristics of the low pass filter.

7. The plasma processing apparatus of claim 1, wherein the frequency-impedance characteristic of the outer electrode seen from the plasma generation space is set such that a frequency slightly lower than the frequency of the first high frequency power is a series resonance frequency, and a series resonance frequency also exists close to the frequency of the second high frequency power.

8. The plasma processing apparatus of claim 1, wherein the frequency of the first high frequency power ranges from 30 MHz to 110 MHz, and the frequency of the second high frequency power ranges from 0.1 MHz to 30 MHz.

9. The plasma processing apparatus of claim 1, further comprising a control unit configured to control the first DC voltage application circuit to adjust the frequency-impedance characteristic of the outer electrode.

10. The plasma processing apparatus of claim 9, wherein at least one of the first and the second DC voltage application circuits includes a low pass filter having a variable impedance controlled by the control unit.

11. The plasma processing apparatus of claim 9, wherein the first DC application circuit includes a low pass filter having a variable impedance controlled by the control unit to adjust the frequency-impedance characteristic of the outer electrode seen from the plasma generation space.

12. The plasma processing apparatus of claim 1, further including at least one control unit, wherein each of the first and second DC voltage application circuits includes a low pass filter having a variable impedance controlled by the at least one control unit to vary impedance characteristics of the inner and outer electrodes as seen from the plasma generation space.

13. A plasma processing method for performing plasma processing on a substrate to be processed in a plasma processing apparatus in which the apparatus includes:

a vacuum evacuable processing chamber accommodating therein a substrate to be processed;

a first electrode provided in the processing chamber and divided into an outer electrode forming an outer portion of the first electrode and an inner electrode forming a central portion of the first electrode;

a second electrode disposed in the processing chamber so as to face the first electrode and supporting the substrate to be processed;

a first high frequency power application unit configured to apply to the second electrode a first high frequency power having a relatively high frequency;

a second high frequency power application unit configured to apply to the second electrode a second high frequency power having a relatively low frequency;

a first DC voltage application circuit configured to apply a DC voltage to the outer electrode;

a second DC voltage application circuit configured to apply a DC voltage to the inner electrode; and a processing gas supply unit configured to supply a processing gas into the processing chamber, wherein a space between the first electrode and the second electrode serves as a plasma generation space, and wherein the outer electrode has a frequency-impedance characteristic seen from the plasma generation space such that an increase of DC voltage to the outer electrode increases impedance of the outer electrode at the frequency of the second high frequency power, and an increase of DC voltage to the outer electrode decreases impedance of the outer electrode at the frequency of the first high frequency; and wherein the method comprises:

setting a DC voltage applied to the inner electrode to a predetermined value;

determining processing conditions by adjusting a DC voltage applied to the outer electrode while applying the DC voltage to the inner electrode so that desired uniformity of the plasma density is obtained, and wherein increasing of the DC voltage to the outer electrode increases impedance of the outer electrode seen from the plasma generation space at the frequency of the second high frequency power, and increasing of the DC voltage to the outer electrode decreases impedance of the outer electrode seen from the plasma generation space at the frequency of the first high frequency power; and performing the plasma processing under the above conditions.

14. A non-transitory computer readable medium which stores a program for controlling a plasma processing apparatus, in which the apparatus includes:
- a vacuum evacuable processing chamber accommodating therein a substrate to be processed;
- a first electrode provided in the processing chamber and divided into an outer electrode forming an outer portion of the first electrode and an inner electrode forming a central portion of the first electrode;
- a second electrode disposed in the processing chamber so as to face the first electrode and supporting the substrate to be processed;
- a first high frequency power application unit configured to apply to the second electrode a first high frequency power having a relatively high frequency;
- a second high frequency power application unit configured to apply to the second electrode a second high frequency power having a relatively low frequency;
- a first DC voltage application circuit configured to apply a DC voltage to the outer electrode;
- a second DC voltage application circuit configured to apply a DC voltage to the inner electrode; and
- a processing gas supply unit configured to supply a processing gas into the processing chamber, wherein a space between the first electrode and the second electrode serves as a plasma generation space, and wherein the outer electrode has a frequency-impedance characteristic seen from the plasma generation space such that an increase of DC voltage to the outer electrode increases impedance of the outer electrode at the frequency of the second high frequency power, and an increase of DC voltage to the outer electrode decreases impedance of the outer electrode at the frequency of the first high frequency; and, wherein the program, when executed, controls the plasma processing apparatus to perform a plasma processing method comprising:
- setting a DC voltage applied to the inner electrode to a predetermined value;
- determining processing conditions by adjusting a DC voltage applied to the outer electrode while applying the DC voltage to the inner electrode so that desired uniformity of the plasma density is obtained, and wherein increasing of the DC voltage to the outer electrode increases impedance of the outer electrode seen from the plasma generation space at the frequency of the second high frequency power, and increasing of the DC voltage to the outer electrode decreases impedance of the outer electrode seen from the plasma generation space at the frequency of the first high frequency power; and
- performing the plasma processing under the above conditions.

* * * * *